United States Patent

Nakamura et al.

Patent Number: 5,382,543
Date of Patent: Jan. 17, 1995

[54] SEMICONDUCTOR DEVICE MANUFACTURING METHOD CAPABLE OF CORRECTLY FORMING ACTIVE REGIONS

[75] Inventors: Takahiro Nakamura; Tomoji Terakado, both of Tokyo, Japan

[73] Assignee: NEC Corporation, Japan

[21] Appl. No.: 95,868

[22] Filed: Jul. 22, 1993

[30] Foreign Application Priority Data

Jul. 23, 1992 [JP] Japan ................... 4-195720

[51] Int. Cl.⁶ ............................ H01L 21/205
[52] U.S. Cl. ................... 437/129; 437/905; 148/DIG. 95
[58] Field of Search ............ 437/129, 905; 148/DIG. 95

[56] References Cited

U.S. PATENT DOCUMENTS

| | | | |
|---|---|---|---|
| 4,835,117 | 5/1989 | Ohba et al. | 437/129 |
| 4,950,622 | 8/1990 | Kwon et al. | 437/129 |
| 5,250,462 | 10/1993 | Sasaki et al. | 437/129 |
| 5,260,230 | 11/1993 | Kondo | 437/129 |

FOREIGN PATENT DOCUMENTS

| | | | |
|---|---|---|---|
| 472221 | 2/1992 | European Pat. Off. | |
| 145184 | 8/1983 | Japan | 437/129 |

Primary Examiner—R. Bruce Breneman
Assistant Examiner—Linda J. Fleck
Attorney, Agent, or Firm—Laff, Whitesel, Conte & Saret, Ltd.

[57] ABSTRACT

In a method of manufacturing a semiconductor device, first strip dielectrics (33) and surfaces (35) were formed by taking first strip parts (31) of a dielectric layer (29) away from a principal surface (13) of a semiconductor substrate (11) in parallel by using a photo-lithography method. Active regions (43) were formed on the first strip surfaces (35) by using a metal organic vapor phase epitaxy method to be covered with lattice planes each of which is (111)B. Second strip dielectrics (35) and surfaces (47) were formed by taking second strip parts (31a) of the first strip dielectrics (31) away from the principal surface (13) with the second strip surfaces (47) positioned between the active regions (43) and the second strip dielectrics (45). Current block regions (57) were formed on the second strip surfaces (47) and the active regions (43) by using the metal organic vapor phase epitaxy method.

4 Claims, 4 Drawing Sheets

5,382,543

SEMICONDUCTOR DEVICE MANUFACTURING METHOD CAPABLE OF CORRECTLY FORMING ACTIVE REGIONS

BACKGROUND OF THE INVENTION

This invention relates to a method of manufacturing a semiconductor device which is used in a semiconductor laser or a light modulator.

In the manner which will later be described more in detail, a conventional method of manufacturing a semiconductor device comprises a first step of preparing a semiconductor substrate having a principal surface, a second step of forming a guide layer on the principal surface, a third step of forming an active layer on the guide layer, a fourth step of forming a cladding layer on the active layer, a fifth step of forming a plurality of strip dielectrics on the cladding layer, a sixth step of taking parts of the guide layer, the active layer, and the cladding layer that are not positioned between the strip dielectrics and the principal surface away from the principal surface by using a wet etching method, a seventh step of taking the strip dielectrics away from the cladding layer by using the wet etching method, an eighth step of forming a current block layer on the cladding layer and the principal surface by using a metal organic vapor phase epitaxy method, a ninth step of forming a cap layer on the current block layer by using the metal organic vapor phase epitaxy method, and a tenth step of forming a high-resistance region surrounding the active layer by pouring protons into preselected regions of the current block layer that surrounds the active layer.

In this method, it is impossible to correctly form the active layer.

SUMMARY OF THE INVENTION

It is therefore an object of the present invention to provide a method of manufacturing a semiconductor device that is capable of correctly forming active regions.

Other objects of this invention will become clear as the description proceeds.

According to this invention, a method for manufacturing a semiconductor device comprises (A) a first step of preparing a semiconductor substrate having a principal surface; (B) a second step of forming a dielectric layer on the principal surface; (C) a third step of taking a plurality of first strip parts of the dielectric layer away from the principal surface in parallel with a distance remaining between the first strip parts, the third step using a photo-lithography method to form a plurality of first strip dielectrics and first strip surfaces of the principal surface that are positioned between the first strip dielectrics: (D) a fourth step of forming a plurality of active regions on the first strip surfaces, respectively, said fourth step using a metal organic vapor phase epitaxy method, each of the active regions being covered with lattice planes each of which is (111)B; (E) a fifth step of taking a plurality of second strip parts of the first strip dielectrics away from the principal surface in parallel, each of the second strip parts being opposed to one of the active regions, to form a plurality of second strip dielectrics and second strip surfaces of the principal surface that are positioned between the active regions and the second strip dielectrics; and (F) a sixth step of forming a plurality of current blocks on the second strip surfaces and the active regions, respectively, said sixth step using the metal organic vapor phase epitaxy method.

DESCRIPTION OF THE PREFERRED EMBODIMENT

Referring to FIG. 1, a conventional method will first be described for a better understanding of this invention.

Figure 1A:
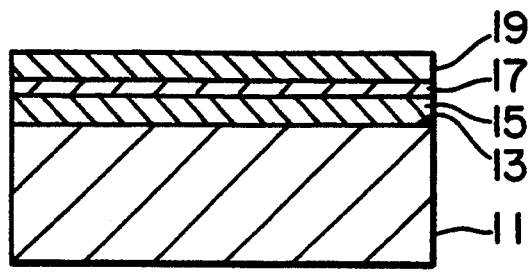
FIGS. 1(a)–1(E) are schematic sectional views for explaining a conventional method of manufacturing a semiconductor device.

In FIG. 1(A), a semiconductor substrate 11 was prepared in the known manner to have a principal surface 13. A guide layer 15 was formed on the principal surface 13. An active layer 17 was formed on the guide layer 15. A cladding layer 19 was formed on the active layer 17.

Figure 1B:
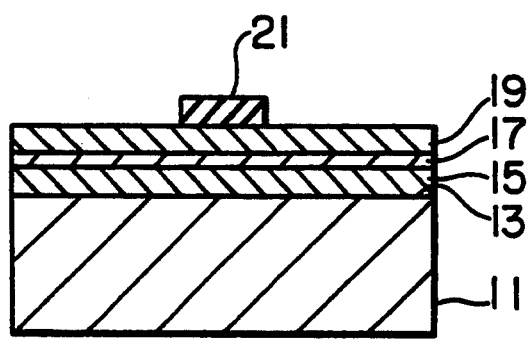

In FIG. 1(B), a plurality of strip dielectrics 21 were formed on the cladding layer 19 by using a chemical vapor deposition method. Although only one strip dielectric 21 is illustrated in FIG. 1(B), for simplification of the figure, the strip dielectrics 21 were actually formed on the cladding layer 19.

Figure 1C:
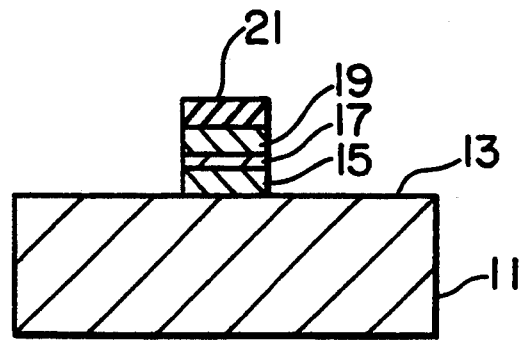

In FIG. 1(C), parts of the guide layer 15, the active layer 17, and the cladding layer 19 that are not positioned between the strip dielectrics 21 and the principal surface 13, were taken away from the principal surface 13 by using a wet etching method.

Figure 1D:
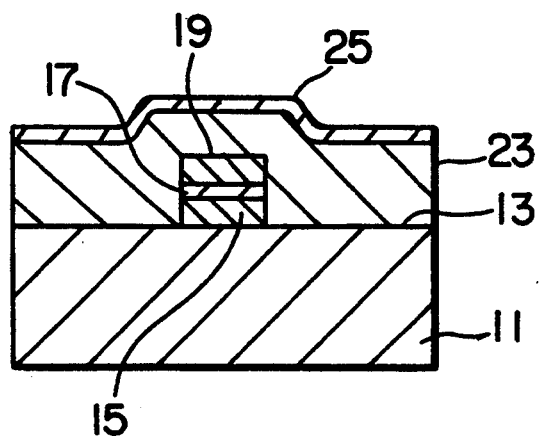

In FIG. 1(D), the strip dielectrics 21 were taken away from the cladding layer 19 by using the wet etching method. A current block layer 23 was formed on the cladding layer 19 and the principal surface 13 by using a metal organic vapor phase epitaxy method. A cap layer 25 was formed on the current block layer 23 by using the metal organic vapor phase epitaxy method.

Figure 1E:
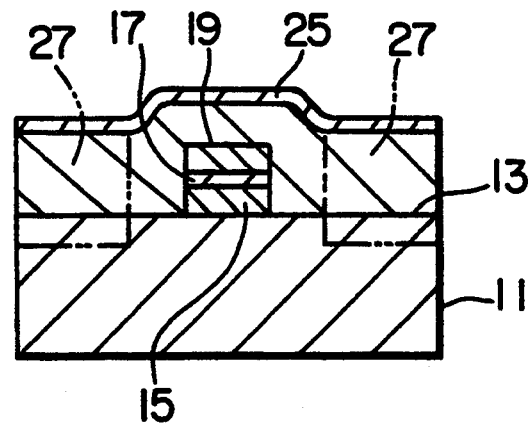

In FIG. 1(E), a high-resistance regions 27 were formed in the current block layer 23 by pouring protons into preselected regions of the current block layer 23 that surrounds the active layer 23.

The semiconductor substrate 11 was made of n-type InP. The guide layer 15 was made of n-type InGaAsP. The active layer 17 was made of InGaAsP. The cladding layer 19 was made of p-type InP. The current block layer 23 was made of p-type InP. The cap layer 25 was made of p-type InGaAsP.

Inasmuch as the active layer 17 is formed by the wet etching method, it is impossible to correctly form the active layer 17.

Referring to FIGS. 2(A) to (F), the description will proceed to a method of manufacturing a semiconductor device according to an embodiment of this invention. Similar parts are designated by like reference numerals.

Figure 2A:
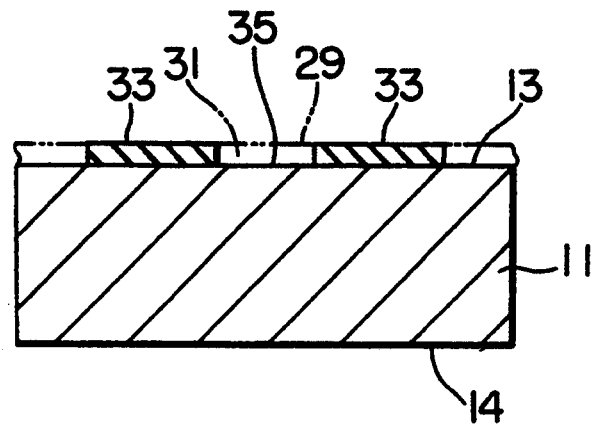
FIGS. 2(a)–2(F) a schematic sectional views for explaining a method according to an embodiment of this invention.

In FIG. 2(A), the semiconductor substrate 11 was prepared in a known manner to have the principal or upper surface 13 and a back or under surface 14. A first dielectric layer 29 was formed on the principal surface 13 by using the chemical vapor deposition method. A plurality of first strip parts 31 of the dielectric layer 29 were taken away from the principal surface 13 in parallel, with a distance 33 on layer 29 remaining between the first strip parts 31, strip parts 31 being formed by using a photo-lithography method. As a result, a plurality of first strip dielectrics 33 were formed on the principal surface 13. Also, a plurality of first strip surfaces 35 of the principal surface 13 were formed between the first strip dielectrics 33.

Figure 2B:
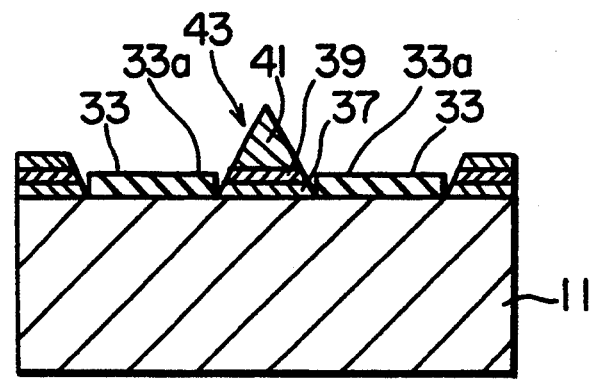

In FIG. 2(B), a first cladding film 37 was formed on each of the first strip surfaces 35 by using the metal organic vapor phase epitaxy method. An active film 39 was formed on the first cladding film 37 by using the metal organic vapor phase epitaxy method. A second cladding film 41 was formed on the active film 39 by using the metal organic vapor phase epitaxy method.

Each of active regions 43 comprises the first cladding film 37, the active film 39, and the second cladding film 41. Although only one active region 43 is illustrated in FIG. 2(B) for simplification of the figure, the active regions 43 were actually formed on the first strip surfaces 35, respectively. Each of the active regions 43 was covered with lattice planes each of which is (111)B.

In FIGS. 2(B) and (C), a plurality of second strip parts 33a of the first strip dialectrics 33 were taken away from the principal surface 13. Each of the second strip parts 33a was opposed to one of the active regions 43. As a result, a plurality of second strip dielectrics 45 were formed on the principal surface 13. Also, a plurality of second strip surfaces 47 of the principal surfaces 13 were formed between the second strip dielectrics 45 and active regions 43, respectively.

Figure 2C:
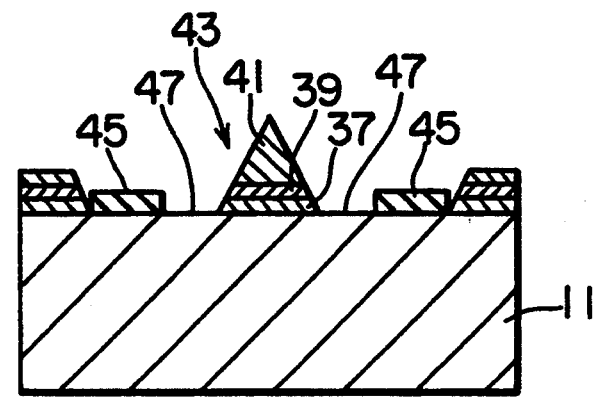
Figure 2D:
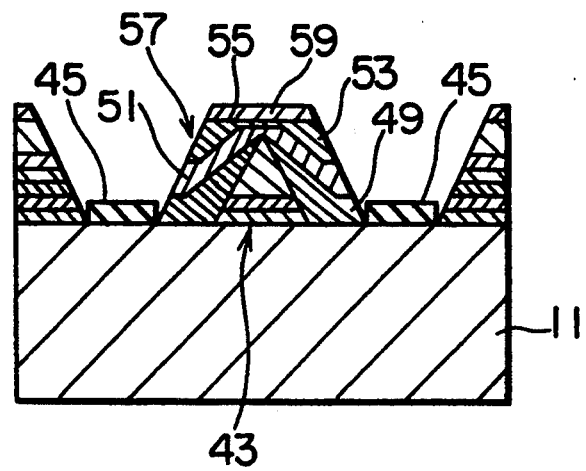

In FIGS. 2(D), a plurality of first p-type semiconductor films 49 were formed on each of the second strip surfaces 47, (FIG. 2(C) and the active regions 43 by using the metal organic vapor phase epitaxy method. A second n-type semiconductor film 51 was formed on the first p-type semiconductor film 49 by using the metal organic vapor phase epitaxy method. A third p-type semiconductor film 53 was formed on the second n-type semiconductor film 51 to have an upper block surface 55 by using the metal organic vapor phase epitaxy method. A current block region 57 comprises the first p-type semiconductor film 49, the second n-type semiconductor film 51, and the third p-type semiconductor film 53. A cap film 59 was formed on the upper block surface 55 by using the metal organic vapor phase epitaxy method.

Figure 2E:
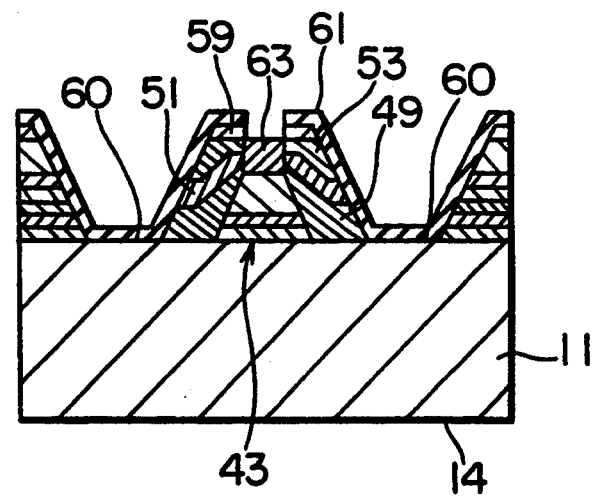

In FIG. 2(E), the second strip dielectrics 45 were taken away from the second strip surfaces 47 by using the wet etching method. As a result, third strip surfaces 60 of the principal surface 13 was formed. A second dielectric layer 61 was formed on the cap films 59, the current block regions 57, and the third strip surfaces 60 by using the chemical vapor deposition. Parts of the second dielectric layer 61 and the cap film 59 were taken away from the upper block surface 55 by using the wet etching method. The parts of the second dielectric layer 61 and the cap film 59 were positioned on the current block region 57 and the active region 43. As a result, a part of the surface of the upper block surface 55 was exposed. Then, Zn was diffused into the current block region 57 and an upper part of the active region 43, the diffusion being through the part of the surface of the upper block surface 55. As a result, a p-type semiconductor part 63 was formed in the current block region 57.

Figure 2F:
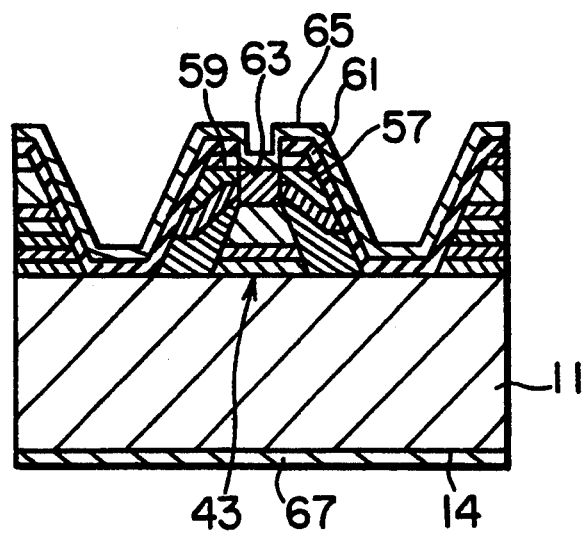

In FIG. 2(F), a p-side electrode layer 65 was formed on the p-type semiconductor parts 63 and the second dielectric layer 61. An n-side electrode layer 67 was formed on the under surface 14.

In FIGS. 2(A) to (C), the semiconductor substrate 11 was made of n-type InP. The first dielectric layer 29 was made of $SiO_2$. The first dielectric layer 29 has a thickness of about 2000 angstrom. Each of the first strip dielectrics 31 has a width of 10 microns. A distance between the first strip dielectrics 31 is 2 microns.

The first cladding film 37 was made of n-type InP which was doped Si. The first cladding film 37 has a thickness of 1000 angstrom and a carrier consistency of $1 \times 10^{18}$ cm$^{-3}$. The actived film 39 was made of InGaAsP. The active film 39 has a thickness of 8,000 angstrom. The active film 39 has an oscillation wave length of 1.55 microns. The second cladding film 41 was made of p-type InP which was doped Zn. The second cladding film 39 has a thickness of 1.7 microns and a carrier density or consistency of $5 \times 10^{17}$ cm$^{-3}$. Each of the second strip dielectrics 45 has a width of 6 microns.

In FIGS. 2(D) to (F), the first p-type semiconductor film 49 was made of p-type InP. The first p-type semiconductor film 49 has a thickness of 1000 angstrom and a carrier density of $5 \times 10^{17}$ cm$^{-3}$. The second n-type semiconductor film 51 was made of n-type InP. The second n-type semiconductor film 51 has a thickness of 0.5 micron and a carrier density of $1 \times 10^{18}$ cm$^{-3}$. The third p-type semiconductor film 53 has a thickness of 1.5 microns and a carrier density of $5 \times 10^{17}$ cm$^{-3}$.

The cap film 59 was made of p$^+$-type InGaAsP. The cap film 59 has a thickness of 0.3 micron and a carrier density of $1 \times 10^{19}$ cm$^{-3}$. The part surface of the upper block surface 55 has a width of 1.5 microns.

It is assumed that a semiconductor layer comprises the semiconductor device illustrated in FIG. 2(F), the semiconductor layer has a resonator length of 300 microns. In this case, the semiconductor laser has a current threshold average of 15 mA and a current threshold standard deviation of 0.2 mA. Also, the semiconductor laser has a slope efficiency average of 0.3 W/A and a slope efficiency standard deviation of 0.04 W/A. In the semiconductor laser, the active film 39 has a width average of 2.0 microns and a width standard deviation of 0.12 micron.

While this invention has thus far been described in conjunction with a single embodiment thereof, it will readily be possible for those skilled in the art to put this invention into practice in various other manners. For example, the active film 39 may have multi-quantum wells.

What is claimed is:

1. A method of manufacturing a semiconductor device, comprising:

a first step of preparing a semiconductor substrate having a principal surface;

a second step of forming a dielectric layer on said principal surface;

a third step of taking a plurality of spaced parallel first strip parts of said dielectric layer away from said principal surface with a distance remaining between said first strip part, said third step being carried out by using a photo-lithography method to form a plurality of first strip dielectrics and first strip surfaces of said principal surface that are positioned between said first strip dielectrics;

a fourth step of forming a plurality of spaced parallel active regions on said first strip surfaces, respectively, by using a metal organic vapor phase epitaxy method, each of said active regions being covered with lattice planes, each of which is (111)B;

a fifth step of taking a spaced parallel plurality of second principal surface, each of said second strip parts being opposed to one of said active regions, in order to form a plurality of second strip dielectrics and second strip surfaces of said principal surface that are positioned between said active regions and said second strip dielectrics; and a sixth step of forming a plurality of thin current block regions on said second strip surfaces and said active regions, respectively, by using the metal organic 30 vapor phase epitaxy method.

2. A method of manufacturing a semiconductor device as claimed in claim 1, wherein said fourth step comprising:

forming a first cladding film on each of first 5 strip surfaces;

forming an active film on said first cladding film; and forming a second cladding film on said active film.

3. A method of manufacturing a semiconductor device as claimed in claim 2, wherein said sixth step comprising:

forming a first p-type semiconductor film on each of said second strip surfaces and said active regions;

forming a second n-type semiconductor film on said first p-type semiconductor film; and forming a third p-type semiconductor film on said second n-type semiconductor.

4. A method of manufacturing a semiconductor device as claimed in claim 3, wherein said semiconductor substrate being made of n-type InP, said dielectric layer being made of $SiO_2$, said first cladding film being made of n-type InP, said active film being made of InGaAsP, said second cladding film being made of p-type InP, said first p-type semiconductor film being made of p-type InP, said second n-type semiconductor film being made of n-type InP, said third p-type semiconductor film being made of p-type InP.

* * * * *